(12) United States Patent
Shyu et al.

(10) Patent No.: US 8,358,476 B2
(45) Date of Patent: Jan. 22, 2013

(54) CONDENSING LENS FOR HIGH CONCENTRATION PHOTOVOLTAIC MODULE AND MANUFACTURING METHOD THEREOF

(75) Inventors: Yann-Mou Shyu, Taoyuan (TW); Yi-Ya Huang, Taoyuan (TW); Hwa-Yuh Shin, Taoyuan (TW); Yi-Shou Chu, Taoyuan (TW)

(73) Assignee: Institute of Nuclear Energy Research, Atomic Energy Council, Executive Yuan (TW)

( * ) Notice: Subject to any disclaimer, the term of this patent is extended or adjusted under 35 U.S.C. 154(b) by 150 days.

(21) Appl. No.: 12/952,523

(22) Filed: Nov. 23, 2010

(65) Prior Publication Data

US 2012/0125398 A1 May 24, 2012

(51) Int. Cl.
*G02B 7/02* (2006.01)
*G02B 3/08* (2006.01)
*G02B 9/00* (2006.01)
*B29D 11/00* (2006.01)

(52) U.S. Cl. ........ 359/820; 359/811; 359/742; 359/796; 264/1.1; 264/1.7; 136/246

(58) Field of Classification Search ............... 359/811, 359/819, 820, 245, 619, 742, 793, 794, 796; 136/244, 246, 256, 258, 259; 257/622; 156/102; 348/340; 250/330
See application file for complete search history.

(56) References Cited

U.S. PATENT DOCUMENTS

| | | | | |
|---|---|---|---|---|
| 4,200,472 A * | 4/1980 | Chappell et al. | ............... | 136/246 |
| 4,834,805 A * | 5/1989 | Erbert | ............... | 136/246 |
| 4,959,546 A * | 9/1990 | Bly | ............... | 250/330 |
| 5,211,761 A * | 5/1993 | Noguchi et al. | ............... | 136/258 |
| 5,541,412 A * | 7/1996 | Tanaka et al. | ............... | 250/332 |
| 6,577,358 B1 * | 6/2003 | Arakawa et al. | ............... | 349/57 |
| 6,641,270 B2 * | 11/2003 | Hannington et al. | ............... | 359/536 |
| 7,423,821 B2 * | 9/2008 | Bechtel et al. | ............... | 359/796 |
| 7,485,799 B2 * | 2/2009 | Guerra | ............... | 136/245 |
| 7,599,134 B2 * | 10/2009 | Bechtel et al. | ............... | 359/796 |
| 7,811,900 B2 * | 10/2010 | Henley | ............... | 438/458 |
| 7,863,157 B2 * | 1/2011 | Henley et al. | ............... | 438/459 |
| 8,053,662 B2 * | 11/2011 | Khazeni et al. | ............... | 136/246 |
| 8,110,480 B2 * | 2/2012 | Henley | ............... | 438/458 |
| 8,237,044 B2 * | 8/2012 | Anzawa et al. | ............... | 136/246 |
| 2011/0280020 A1 * | 11/2011 | Chen et al. | ............... | 362/294 |

* cited by examiner

*Primary Examiner* — Loha Ben
(74) *Attorney, Agent, or Firm* — Bacon & Thomas, PLLC (57) ABSTRACT

The present invention discloses a manufacturing method of a condensing lens for a high concentration photovoltaic (HCPV) module. A buffer layer made of silicone is added between a glass and the condensing lens for adhering the glass to the condensing lens. Because the buffer layer can be formed on the glass before adhering to the condensing lens, a higher temperature for increasing adhesion between the glass and the buffer layer can be applied. It also allows the follow-up processes to have sufficient treatment time, thereby increasing the flexibility of processing schedule.

20 Claims, 10 Drawing Sheets

CONDENSING LENS FOR HIGH CONCENTRATION PHOTOVOLTAIC MODULE AND MANUFACTURING METHOD THEREOF

FIELD OF THE INVENTION

The present invention relates to a manufacturing method of a condensing lens for a high concentration photovoltaic (HCPV) module. More particularly, the present invention relates to an improving method for manufacturing the condensing lens with high yield rate.

BACKGROUND OF THE INVENTION

Due to increase of gasoline price and greenhouse effect, people pay more attention to green industries. The green industries keep developing significantly. In recent year, technologies related to solar energy are improving in a very fast pace. Market main streams are silicon solar energy, thin film solar energy and concentrator photovoltaic (CPV) energy. Key parts of a concentrator photovoltaic module are Fresnel lens, III-V compound chips and the solar tracking system. Design thereof is very important to the efficiency of power generation. Concentrator photovoltaic energy system is used to focus solar energy by Fresnel lens so that the number of solar chips can be reduced. Meanwhile, better photoelectric conversion rate compared with that of conventional single crystal silicon, multi-crystal silicon or thin film solar cells can be available. The material used is polymethyl methacrylate (PMMA). The advantage is mature manufacturing process and cheap cost. However, this material can not withstand ultraviolet (UV) radiation so that it is easy to become yellow and reduce the ability to accept solar energy. Usually, life time of PMMA concentrators is about 3~5 years. It is to say that power generation efficiency will soon reduce with time. In order to settle this issue, the best solution so far is to use a combination of silicone and glass (Silicone-On-Glass, SOG). Life time is estimated to be over 20 years. However, it is not easy for the combination of two materials to pass environment test. A commonly seen problem is peel-off. It causes the finished products useless after a period of time of use.

Silicone is mainly formed by the combination of silicon and oxygen. Average bonding energy (444 KJ/mol) of the combination is higher than that of carbon with carbon (356 KJ/mol) and carbon with oxygen (339 KJ/mol) in plastic materials, so the silicone can withstand high temperature. Silicone for optical use has high resistance against UV, and thus is not easy to become yellow. Furthermore, it can withstand high temperature. Therefore, it can be used in high temperature environments. It has low water absorption to endure high humidity. It has high light transmission. With respect to spectrum from ultraviolet to infrared light beams, the light transmission is better than other materials. It has high flowability, low viscosity and fast shaping features for mass production.

A prior art for manufacturing silicone glass condensing lens is to wash surface of a glass in advance and spread a primer on the glass. The primer is used to bond the glass and a silicone condensing lens. When the primer is ready to spread, the glass can be used to cover on a Fresnel lens mold filled with silicone. This is called imprinting method. Otherwise, the glass can cover a Fresnel lens mold which is not filled by silicone before silicone is injected to the space between the Fresnel lens mold and glass. This is injection molding. Then, silicone solidification process is performed. After the silicone is solidified completely and released, manufacturing of silicone glass condensing lens is finished.

However, there are still some problems for the conventional manufacturing method for glass condensing lens which need to be solved. First, adhesion between the glass and silicone is not good. It is easy to cause silicone to peel off when stripping, thereby damaging the Fresnel lens mold. Second, the primer is easy to react with air. Adhesion of the primer between the glass and silicone will decay along with time. Third, reaction temperature of the primer is high. Therefore, the Fresnel lens mold needs to use metallic materials to withstand high temperature baking. Cost of silicone glass condensing lens will increase.

A number of conventional ways for enhancing lens bonding are as follows.

Figure 1:
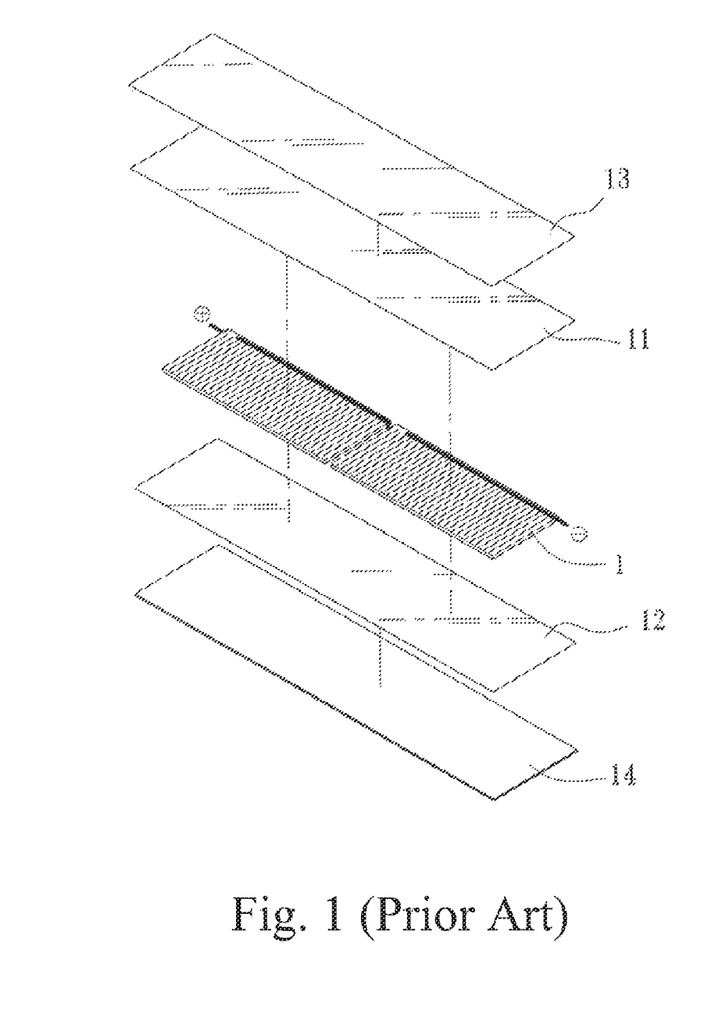
FIG. 1 illustrates a first prior art.

Please refer to FIG. 1. A structure of solar battery package is disclosed. It is to cover a solar cell 1 with a top cladding layer 11 and a lower cladding layer 12 made of ethylene vinyl acetate (EVA) first. Then, a top layer 13 and a bottom layer 14 made of Celluloid and Teflon, respectively, form a structure composed of five layers. It has high degree of transparency so that the sunlight passes through easily. In addition, it has very desirable softness and flexibility, light weight and good strength characteristics. The aforementioned characteristics increase the usage of the solar battery module which, for example, can be used in solar energy vehicles. However, the prior art only discloses use of EVA as an adhesive. No improvement to increasing adhesion between the glass and the condensing lens is mentioned.

Figure 2:
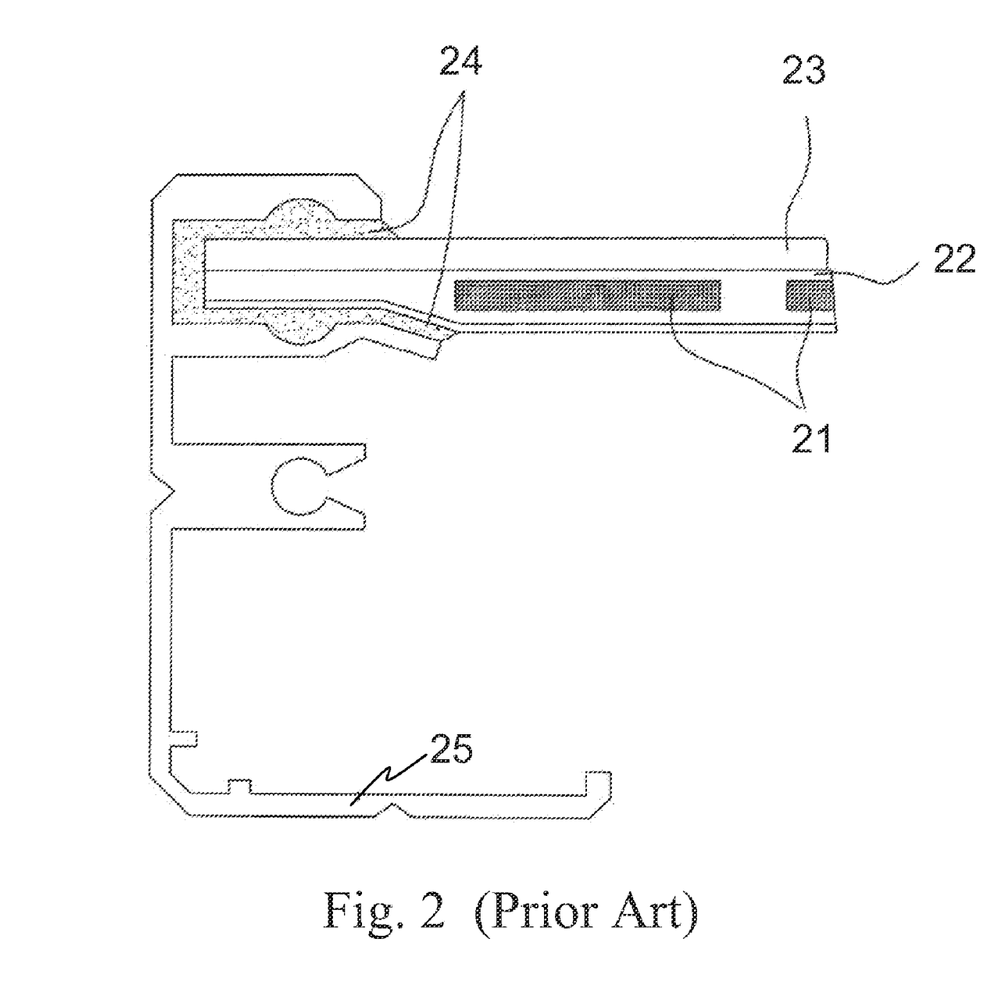
FIG. 2 illustrates a second prior art.

Please refer to FIG. 2. Another structure of solar battery package is disclosed. After the solar battery 21 is soldered, EVA material 22 is evenly spread in the solar cells 21. Later, the EVA material 22 surface is covered with low-iron glass 23. Then, it is embedded in a bracket 25 having a mattress 24 therebetween. However, like the structure of solar battery package mentioned above, the prior art only discloses EVA as an adhesive, and no improvement to increasing adhesion between the glass and the condensing lens is mentioned.

Figure 3:
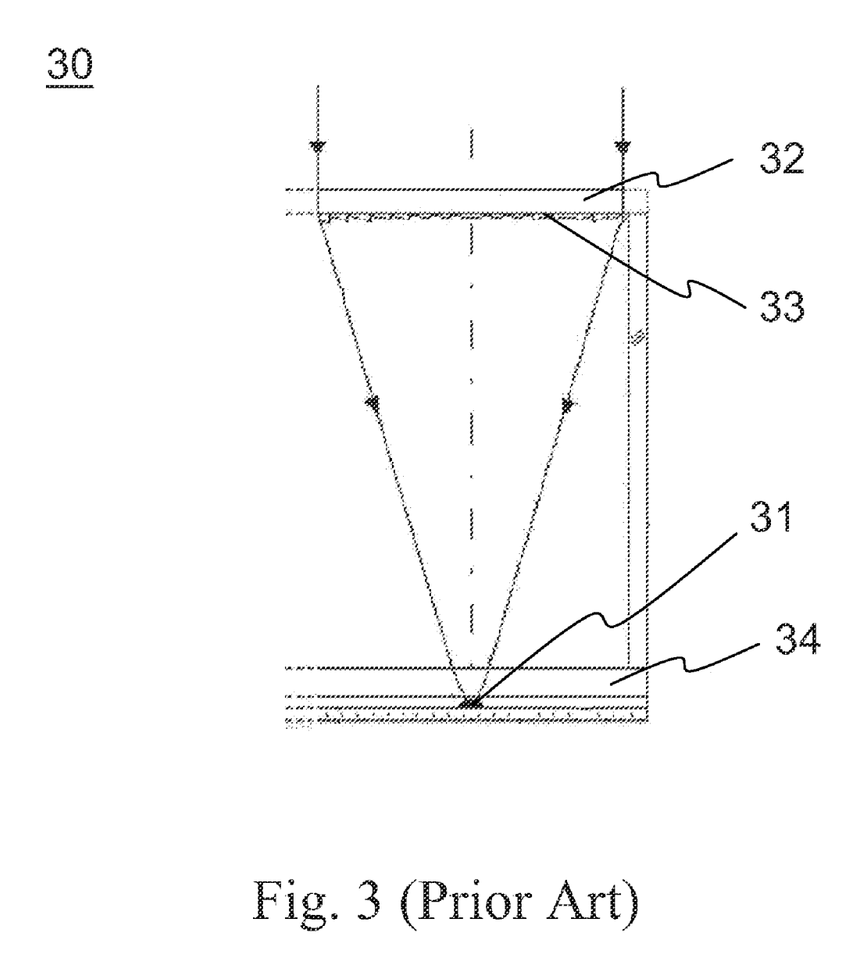
FIG. 3 illustrates a third prior art.

Please refer to FIG. 3. US Publication No. 2009-0277493 discloses an optoelectronic device 30. It has a solar cells 31 which has a surface smaller than a light entering surface 32 of the optoelectronic device 30; an optical unit 33 for focusing the sunlight onto a default area; and a transparent carrier 34. However, the invention doesn't disclose how to increase adhesion between the light entering surface 32 and the optical unit 33.

Figure 4:
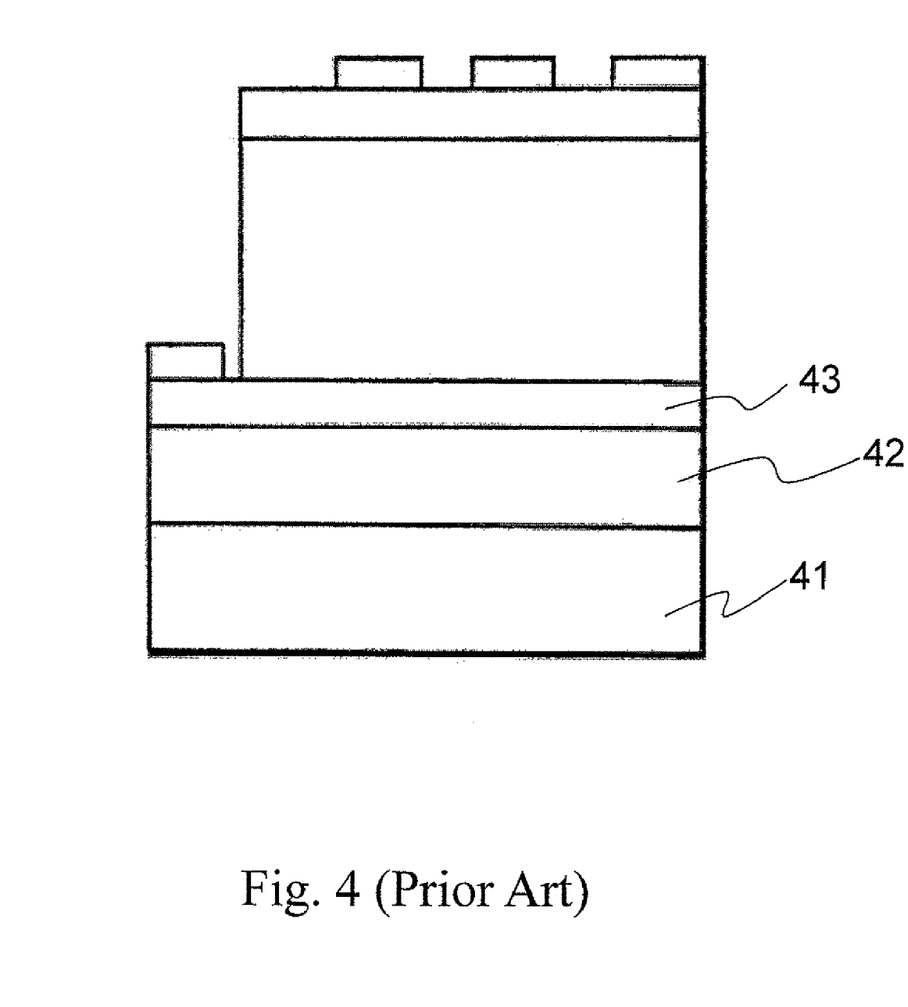
FIG. 4 illustrates a fourth prior art.

Please refer to FIG. 4. U.S. Pat. No. 5,211,761 discloses a method to increase adhesion between the substrate 41 (ceramic or quartz glass) and a polycrystalline silicon layer 43. It improves the adhesion therebetween by adding one or more adhesive layers 42 composed of silicone, silicide, cement, or silicon carbide between the substrate 41 and the polycrystalline silicon layer 43. However, the method for improving adhesion is not applied between the glass and a condensing lens.

This shows that the methods used in the industry to bond condensing lens and glass substrate still can not effectively solve the aforementioned disadvantages, causing poor production yield and high cost of silicone glass condensing lens. Thus, a simple and inexpensive method for bonding a condensing lens and a glass substrate at high operating temperature is desperately desired.

SUMMARY OF THE INVENTION

This paragraph extracts and compiles some features of the present invention; other features will be disclosed in the follow-up paragraphs. It is intended to cover various modifications and similar arrangements included within the spirit and scope of the appended claims.

In accordance with an aspect of the present invention, a manufacturing method of a condensing lens assembly for a high concentration photovoltaic (HCPV) module, includes the steps of: a) providing a substrate; b) covering the substrate with a buffer layer; c) integrating the substrate and the buffer layer by heating to a first temperature; and d) molding and solidifying a lens on the buffer layer at a second temperature.

Preferably, the substrate is a low-iron tempered glass.

Preferably, the integrating step includes a step of bonding the substrate and the buffer layer by a primer before heating.

Preferably, the buffer layer is made of silicone.

Preferably, the first temperature is higher than 110° C.

Preferably, the second temperature is lower than 70° C.

Preferably, the lens is a Fresnel lens.

Preferably, the lens is imprinted on the buffer layer.

Preferably, the lens is injection molded on the buffer layer.

Preferably, the lens is preformed to attach on the buffer layer.

In accordance with another aspect of the present invention, a condensing lens for a high concentration photovoltaic (HCPV) module, includes a substrate for passing light beams and providing support; a lens for focusing light beams; and a buffer layer formed between the substrate and the lens, for bonding the substrate and the lens. The substrate is bonded with the buffer layer at a first temperature and the lens is formed on the buffer layer at a second temperature.

Preferably, the substrate is a low-iron tempered glass.

Preferably, a primer is formed between the substrate and the buffer layer to bond the substrate and the buffer layer.

Preferably, the first temperature is higher than 110° C.

Preferably, the second temperature is lower than 70° C.

Preferably, the buffer layer is made of silicone.

Preferably, the lens is a Fresnel lens.

Preferably, the lens is imprinted on the buffer layer.

Preferably, the lens is injection molded on the buffer layer.

Preferably, the lens is preformed to attach on the buffer layer.

DETAILED DESCRIPTION OF THE PREFERRED EMBODIMENTS

The present invention will now be described more specifically with reference to the following embodiments. It is to be noted that the following descriptions of preferred embodiments of this invention are presented herein for purpose of illumination and description only; it is not intended to be exhaustive or to be limited to the precise form disclosed. Two embodiments are used to illustrate the spirit of the present invention.

First Embodiment

Figure 5:
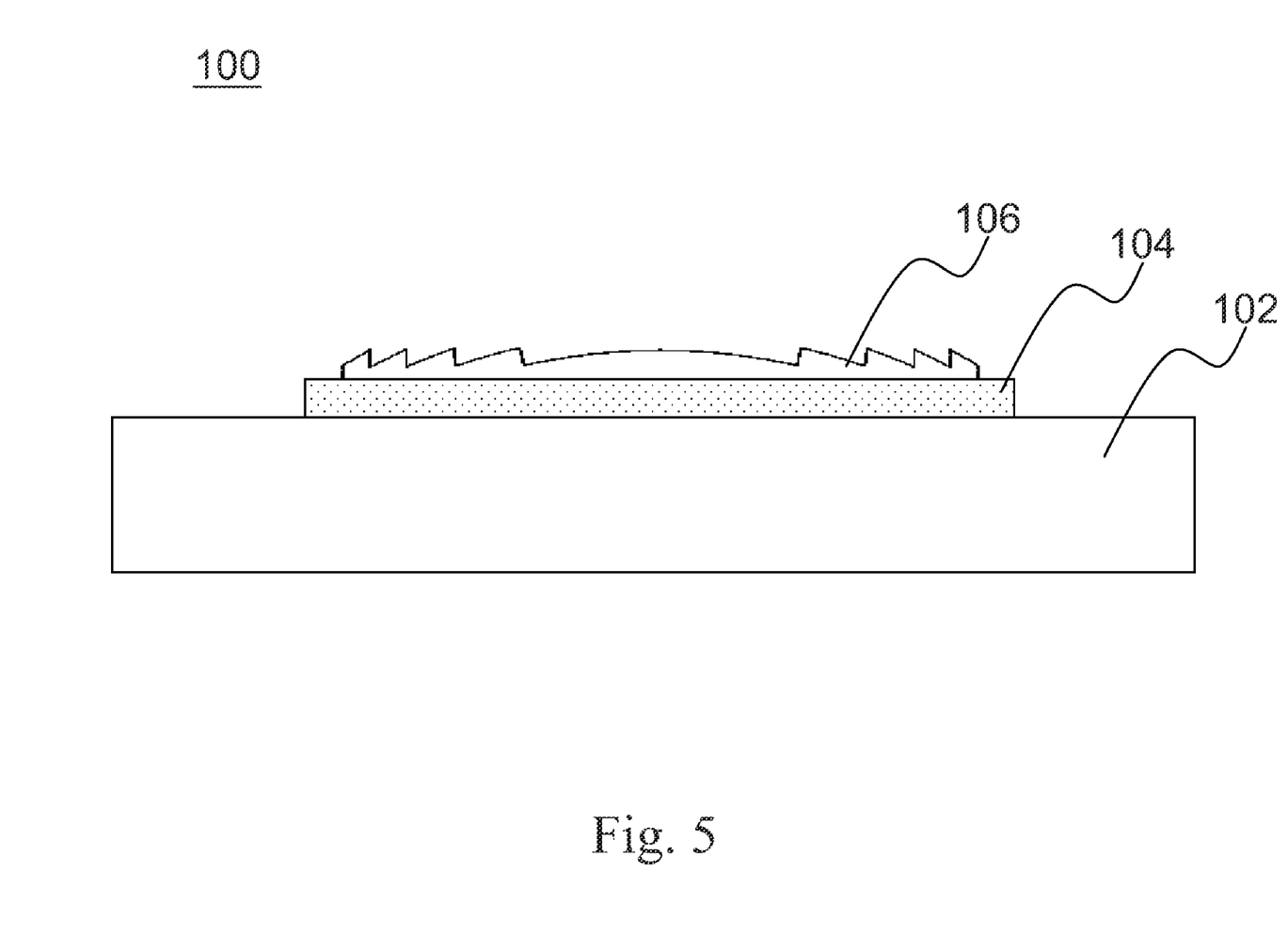
FIG. 5 shows a first embodiment of the present invention.
Figure 6:
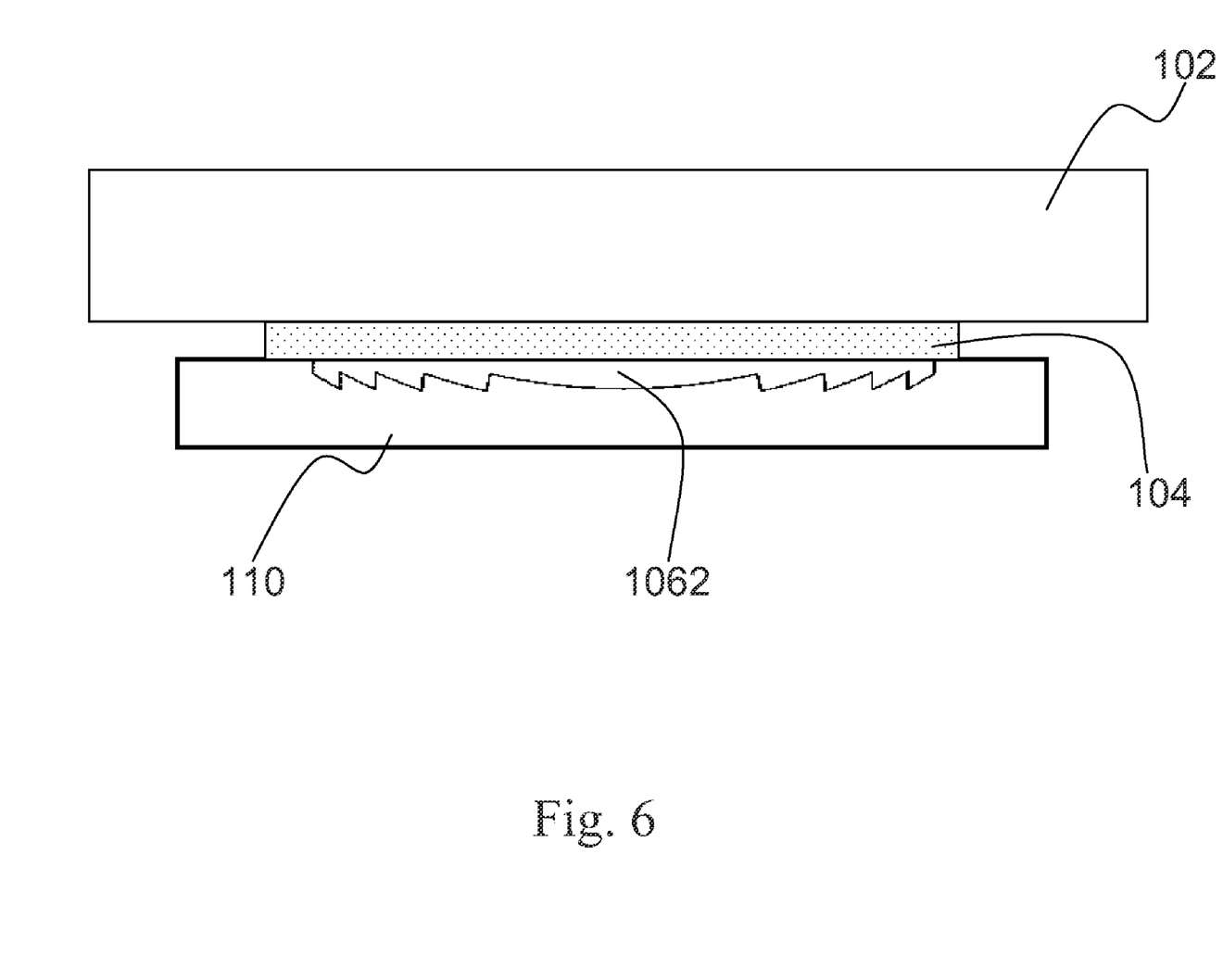
FIG. 6 and FIG. 7 shows processes for manufacturing a condensing lens.
Figure 7:
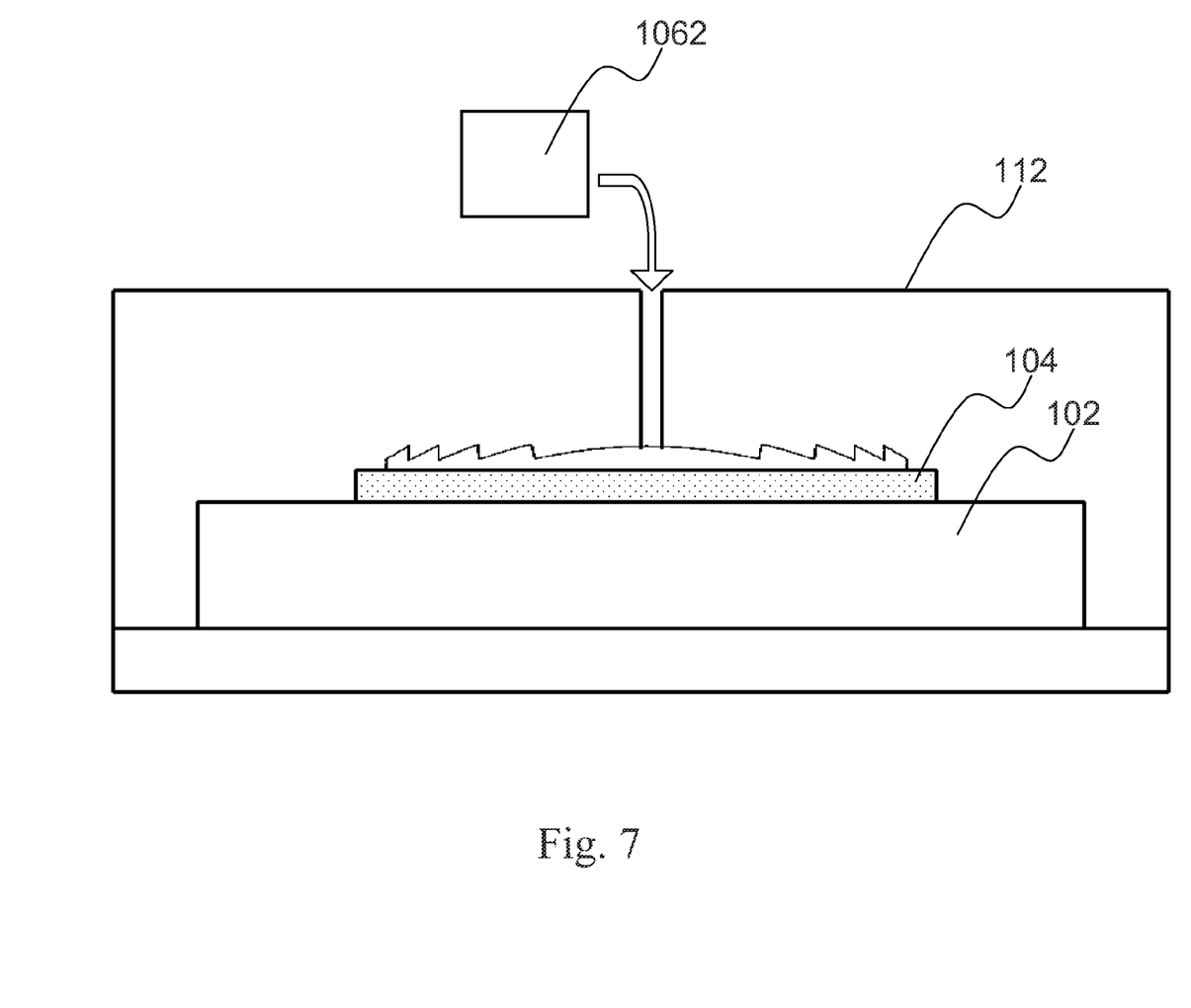
Figure 8:
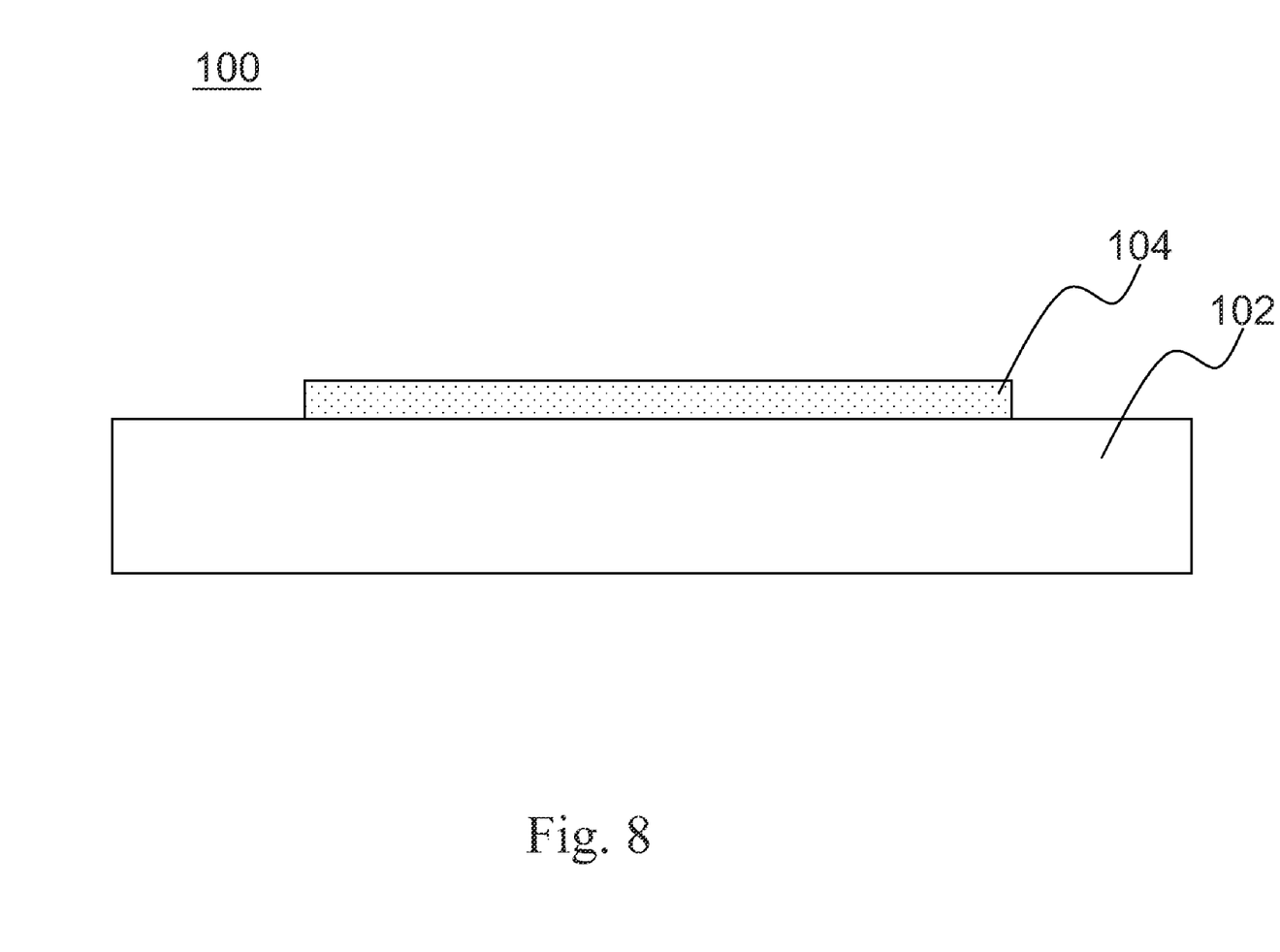
FIG. 8 and FIG. 9 illustrate manufacturing processes of the first embodiment.
Figure 9:
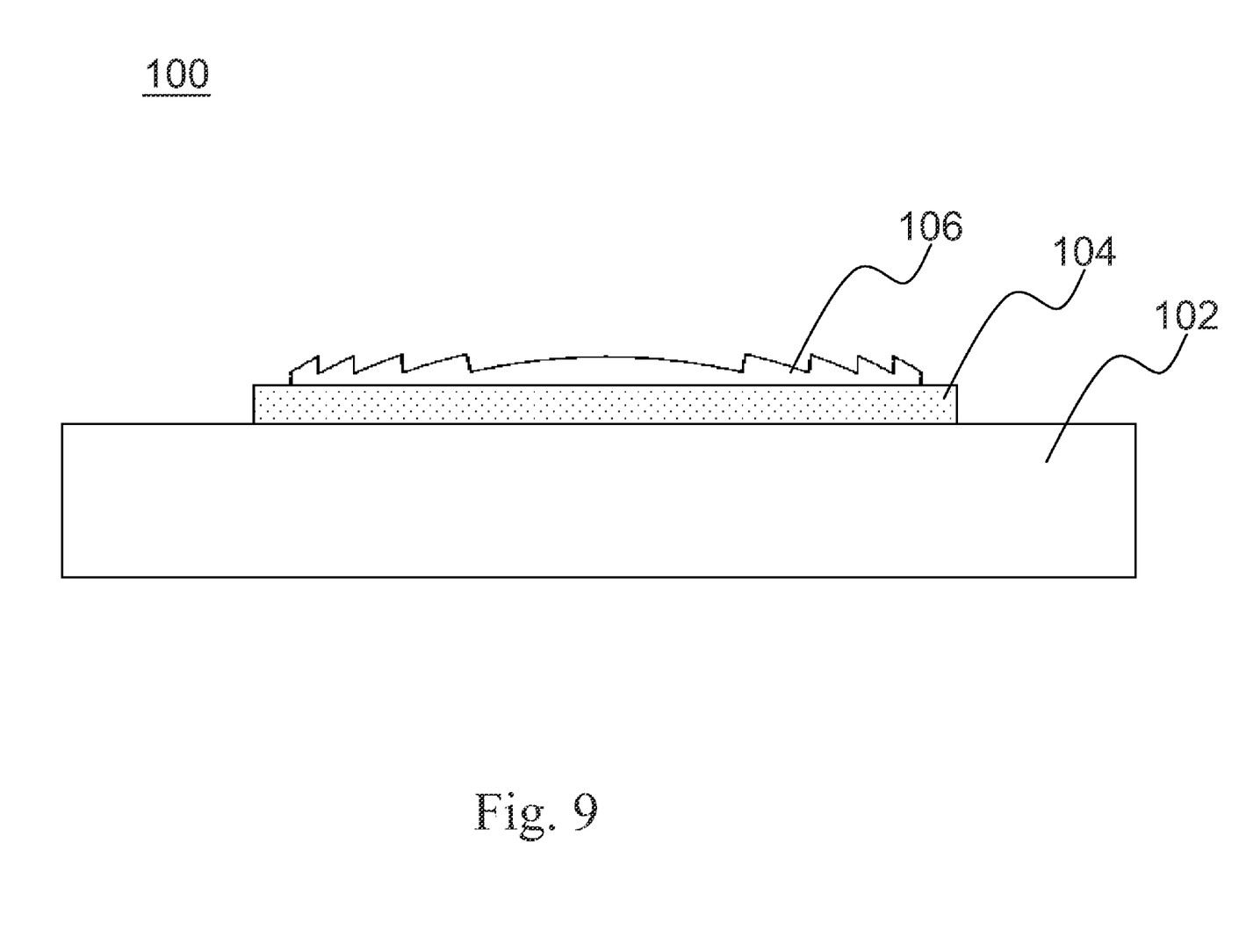

Please refer to FIG. 5 to FIG. 9. FIG. 5 shows a condensing lens for a high concentration photovoltaic (HCPV) module according to the spirit of the present invention. FIG. 6 and FIG. 7 illustrate manufacturing processes of a condensing lens. FIG. 8 and FIG. 9 introduce a method for manufacturing a lens.

According to the spirit of the present invention, a condensing lens 100 is composed of a substrate 102, a buffer layer 104 and a lens 106. The substrate 102 can support the buffer layer 104 and pass light beams. In practice, the substrate 102 is a low-iron tempered glass. The buffer layer 104 is made of silicone. It is formed between the substrate 102 and the lens 106. It can bond the substrate 102 and the lens 106. The lens 106 is a Fresnel lens. It can focus light beams to a solar cell module (not shown) for generating power.

There are three kinds of methods to make the lens 106. First, a glass substrate pasted with the buffer layer 104 covers a Fresnel lens mold 110 filled with silicone 1062. This is imprinting method. Please refer to FIG. 6.

Second, the substrate 102 pasted with the buffer layer 104 covers a Fresnel lens mold 112, without silicone 1062 inside. Please refer to FIG. 7. Then, silicone 1062 is injection molded into the space between the Fresnel lens 112 and the buffer layer 104. This is injection molding method.

Third, a preformed Fresnel lens is stuck on the buffer layer 104. This is preforming method. Then, the silicone is solidified. After the silicone is completely solidified, the lens 106 is released from the Fresnel lens mold 112 by the first and second methods. Manufacture of silicone glass condensing lens 100 is finished. In practice, these methods are all workable. The present invention is not limited to any one of the methods for manufacturing the lens 106.

Then, please refer to FIG. 8 and FIG. 9. Manufacturing processes for the mentioned condensing lens 100 are as follow. First, the substrate 102 is provided. The substrate 102 is covered with the buffer layer 104. The substrate 102 and the buffer layer 104 are heated up to a first temperature. Now, the substrate 102 is bonded with the buffer layer 104. Then, the lens 106 is bonded to the buffer layer 104 at a second temperature with the methods mentioned above. In this embodiment, the first temperature is higher than 110° C. and the second temperature is lower than 70° C.

According to the spirit of the present invention, a primer operated as an adhesive for bonding the substrate 102 and the buffer layer 104 can be used on the substrate 102 in the present embodiment.

Second Embodiment

Figure 10:
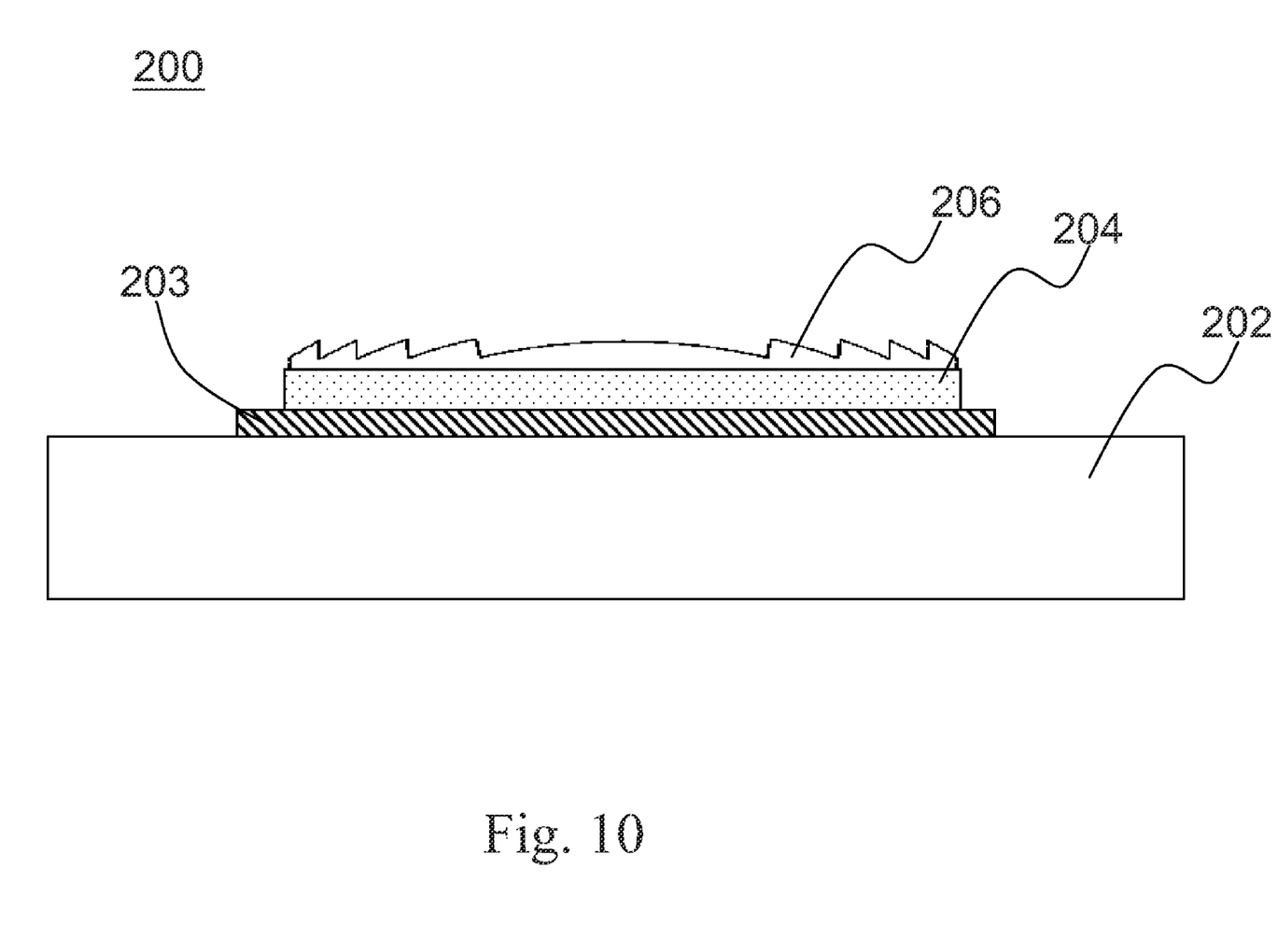
FIG. 10 shows a second embodiment of the present invention.

Please refer to FIG. 10. FIG. 10 shows a condensing lens according to the spirit of the present invention. Because the manufacturing processes for the second embodiment are the same as those of the first embodiment, they are omitted for brevity.

According to the spirit of the present invention, a condensing lens 200 is composed of a substrate 202, a buffer layer 204 and a lens 206. The substrate 202 is used to support the buffer layer 204 and pass light beams. The substrate 202 further has a primer layer 203 thereupon as an adhesive to bond the substrate 202 and the buffer layer 204. Thus, the lens 206 will be bonded on the substrate 202 more effectively than that in the first embodiment.

Similarly, the buffer layer 204 is made of silicone and formed on the primer layer 203 to bond with the lens 206. The lens 206 is a Fresnel lens. It can focus light beams to a solar cell module (not shown) for generating power. Manufacturing method of the lens 206 is the same as that described in the first embodiment. Duplicate description is thus omitted. In a preferable condition as the first embodiment, the substrate 202 is bonded with the buffer layer 204 at a temperature over 110° C. The lens 206 is formed on the buffer layer 104 and is bonded with the substrate 202 at a temperature below 70° C.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A manufacturing method of a condensing lens assembly for a high concentration photovoltaic (HCPV) module, comprising the steps of:
    a) providing a substrate;
    b) covering the substrate with a buffer layer;
    c) integrating the substrate and the buffer layer by heating to a first temperature; and
    d) molding and solidifying a condensing lens on the buffer layer at a second temperature.

2. The manufacturing method according to claim 1, wherein the substrate is a low-iron tempered glass.

3. The manufacturing method according to claim 1, wherein the integrating step comprises a step of bonding the substrate and the buffer layer by a primer before heating.

4. The manufacturing method according to claim 1, wherein the buffer layer is made of silicone.

5. The manufacturing method according to claim 1, wherein the first temperature is higher than 110° C.

6. The manufacturing method according to claim 1, wherein the second temperature is lower than 70° C.

7. The manufacturing method according to claim 1, wherein the lens is a Fresnel lens.

8. The manufacturing method according to claim 1, wherein the lens is imprinted on the buffer layer.

9. The manufacturing method according to claim 1, wherein the lens is injection molded on the buffer layer.

10. The manufacturing method according to claim 1, wherein the lens is preformed to attach on the buffer layer.

11. A condensing lens for a high concentration photovoltaic (HCPV) module, comprising:
    a substrate for passing light beams and providing support;
    a lens for focusing light beams; and
    a buffer layer formed between the substrate and the lens, for bonding the substrate and the lens;
    wherein the substrate is bonded with the buffer layer at a first temperature and the lens is formed on the buffer layer at a second temperature.

12. The condensing lens according to claim 11, wherein the substrate is a low-iron tempered glass.

13. The condensing lens according to claim 11, wherein a primer is formed between the substrate and the buffer layer to bond the substrate and the buffer layer prior to heating to the first temperature.

14. The condensing lens according to claim 11, wherein the first temperature is higher than 110° C.

15. The condensing lens according to claim 11, wherein the second temperature is lower than 70° C.

16. The condensing lens according to claim 11, wherein the buffer layer is made of silicone.

17. The condensing lens according to claim 11, wherein the lens is a Fresnel lens.

18. The condensing lens according to claim 11, wherein the lens is imprinted on the buffer layer.

19. The condensing lens according to claim 11, wherein the lens is injection molded on the buffer layer.

20. The condensing lens according to claim 11, wherein the lens is preformed to attach on the buffer layer.

* * * * *